(12) United States Patent
Lyon

(10) Patent No.: US 12,218,478 B2
(45) Date of Patent: Feb. 4, 2025

(54) FOLDED OPTICAL CONJUGATE LENS

(71) Applicant: Apple Inc., Cupertino, CA (US)

(72) Inventor: Keith Lyon, San Jose, CA (US)

(73) Assignee: APPLE INC., Cupertino, CA (US)

( * ) Notice: Subject to any disclaimer, the term of this patent is extended or adjusted under 35 U.S.C. 154(b) by 476 days.

(21) Appl. No.: 17/233,489

(22) Filed: Apr. 18, 2021

(65) Prior Publication Data

US 2021/0351561 A1    Nov. 11, 2021

Related U.S. Application Data

(60) Provisional application No. 63/022,501, filed on May 10, 2020.

(51) Int. Cl.
| | | |
|---|---|---|
| *H01S 5/183* | (2006.01) | |
| *H01S 5/0225* | (2021.01) | |
| *H01S 5/343* | (2006.01) | |
| *H01S 5/42* | (2006.01) | |

(52) U.S. Cl.
CPC ........ *H01S 5/0225* (2021.01); *H01S 5/18344* (2013.01); *H01S 5/34313* (2013.01); *H01S 5/423* (2013.01)

(58) Field of Classification Search
CPC .................................................. H01S 5/18388
See application file for complete search history.

(56) References Cited

U.S. PATENT DOCUMENTS

| | | | |
|---|---|---|---|
| 6,751,379 | B2 | 6/2004 | Capewell et al. |
| 7,257,141 | B2 | 8/2007 | Chua |
| 7,825,423 | B2 | 11/2010 | Shiraishi et al. |
| 8,526,476 | B2 | 9/2013 | Engl et al. |

(Continued)

FOREIGN PATENT DOCUMENTS

| | | |
|---|---|---|
| CN | 101189554 A | 5/2008 |
| CN | 102709808 A | 10/2012 |

(Continued)

OTHER PUBLICATIONS https://web.archive.org/web/20150711124833/https://www.jedec.org/standards-documents/dictionary/terms/substrate-semiconductor-device-1-general (Year: 2015).*

(Continued)

*Primary Examiner* — Tod T Van Roy
*Assistant Examiner* — Stephen Sutton Kotter
(74) *Attorney, Agent, or Firm* — Meitar Patents Ltd.; Daniel Kligler

(57) ABSTRACT

An optoelectronic device includes a semiconductor substrate having first and second faces. An emitter is disposed on the first face of the semiconductor substrate and is configured to emit a beam of radiation through the substrate. At least one curved optical surface is formed in the second face of the semiconductor substrate. A first reflector is disposed on the first face in proximity to the emitter, and a second reflector is disposed on the second face in proximity to the curved optical surface, such that the second reflector reflects the beam that was emitted through the semiconductor substrate by the emitter to reflect back through the semiconductor substrate toward the first reflector, which then reflects the beam to pass through the semiconductor substrate so as to exit from the semiconductor substrate through the curved optical surface.

15 Claims, 3 Drawing Sheets

(56) References Cited

U.S. PATENT DOCUMENTS

| | | |
|---|---|---|
| 8,783,893 B1 | 7/2014 | Seurin |
| 9,048,633 B2 | 6/2015 | Gronenborn et al. |
| 9,112,330 B2 | 8/2015 | Gronenborn et al. |
| 9,553,423 B2 | 1/2017 | Chen et al. |
| 9,746,369 B2 | 8/2017 | Shpunt et al. |
| 10,072,815 B2 | 9/2018 | MacKinnon et al. |
| 10,295,145 B2 | 5/2019 | MacKinnon et al. |
| 11,025,898 B2 | 6/2021 | Avraham et al. |
| 2002/0048292 A1 | 4/2002 | Bissinger et al. |
| 2002/0181536 A1* | 12/2002 | Jeon .................. H01S 5/18388 372/96 |
| 2003/0011888 A1 | 1/2003 | Cox et al. |
| 2003/0026310 A1 | 2/2003 | Valliath |
| 2004/0070706 A1* | 4/2004 | Freeman ........... G02F 1/133512 349/110 |
| 2004/0070855 A1 | 4/2004 | Benitez et al. |
| 2004/0130790 A1 | 7/2004 | Sales |
| 2004/0184155 A1 | 9/2004 | Kornblit et al. |
| 2006/0045144 A1 | 3/2006 | Karlsen et al. |
| 2006/0066192 A1 | 3/2006 | Beeson et al. |
| 2007/0071056 A1 | 3/2007 | Chen |
| 2008/0054281 A1 | 3/2008 | Narendran et al. |
| 2008/0267232 A1 | 10/2008 | DeNatale |
| 2009/0032511 A1 | 2/2009 | Adams et al. |
| 2009/0161033 A1 | 6/2009 | Kaise |
| 2010/0019136 A1 | 1/2010 | Merenda et al. |
| 2010/0171866 A1 | 7/2010 | Brady et al. |
| 2010/0208763 A1 | 8/2010 | Engl et al. |
| 2011/0019048 A1 | 1/2011 | Raynor et al. |
| 2012/0147912 A1 | 6/2012 | Moench et al. |
| 2012/0248977 A1* | 10/2012 | Ootorii ................. H01L 24/83 313/523 |
| 2013/0266326 A1* | 10/2013 | Joseph ............... H04B 10/1141 398/130 |
| 2013/0329429 A1 | 12/2013 | Lowes et al. |
| 2013/0334559 A1 | 12/2013 | Vdovin et al. |
| 2015/0092802 A1 | 4/2015 | Gronenborn et al. |
| 2015/0340841 A1 | 11/2015 | Joseph |
| 2016/0164261 A1 | 6/2016 | Warren |
| 2017/0033535 A1 | 2/2017 | Joseph |
| 2018/0038944 A1 | 2/2018 | Hellmig et al. |
| 2018/0041755 A1 | 2/2018 | Fettig et al. |
| 2019/0052365 A1* | 2/2019 | Joseph ............... H01S 5/18388 |
| 2019/0273906 A1 | 9/2019 | Xiao et al. |
| 2019/0302917 A1* | 10/2019 | Pan ..................... H01L 27/1266 |
| 2019/0312413 A1* | 10/2019 | Sirbu ................. H01S 5/18377 |
| 2019/0363520 A1 | 11/2019 | Laflaquiere et al. |
| 2020/0057145 A1 | 2/2020 | Townsend et al. |
| 2020/0081165 A1 | 3/2020 | Avraham et al. |
| 2020/0169061 A1* | 5/2020 | Mitomo ............. H01S 5/04253 |
| 2020/0194973 A1 | 6/2020 | Bloemen et al. |
| 2020/0194975 A1 | 6/2020 | Gronenborn et al. |
| 2020/0209729 A1 | 7/2020 | Chen et al. |
| 2020/0251882 A1 | 8/2020 | Lyon et al. |
| 2020/0350744 A1 | 11/2020 | Gerlach |
| 2020/0367967 A1 | 11/2020 | Lee |
| 2021/0013703 A1 | 1/2021 | Numata et al. |
| 2021/0104873 A1* | 4/2021 | Gerlach ............. G01B 9/02092 |

FOREIGN PATENT DOCUMENTS

| | | |
|---|---|---|
| CN | 103412406 A | 11/2013 |
| CN | 105874662 A | 8/2016 |
| CN | 106990659 A | 7/2017 |
| CN | 111367136 A | 7/2020 |
| CN | 211375111 U | 8/2020 |
| DE | 102007029370 A1 | 11/2008 |
| EP | 0488772 A1 | 6/1992 |
| JP | 09061610 A1 | 3/1997 |
| JP | 2000244056 A | 9/2000 |
| JP | 2012181243 A | 9/2012 |
| WO | 2010067261 A1 | 6/2010 |
| WO | 2016023133 A1 | 2/2016 |
| WO | 2016116290 A1 | 7/2016 |
| WO | 2016122404 A1 | 8/2016 |
| WO | 2016131658 A1 | 8/2016 |
| WO | 2018053378 A1 | 3/2018 |
| WO | 2019181757 A1 | 9/2019 |

OTHER PUBLICATIONS https://web.archive.org/web/20150711124833/https://www.jedec.org/standards-documents/dictionary/terms/substrate-semiconductor-device-1-general (Year: 2024).*

U.S. Appl. No. 16/779,609 Office Action dated May 26, 2022.

KR Application # 10-2020-7017879 Office Action dated Aug. 18, 2022.

International Application # PCT/US2021/027853 Search Report dated Jul. 13, 2021.

Zhan et al.,"Confined Etchant Layer Technique (CELT) for Micromanufacture," Proceedings of the 6th IEEE International Conference on Nano/Micro Engineered and Molecular Systems, pp. 863-867, Feb. 20-23, 2011.

Gimkiewicz et al., "Fabrication of microprisms for planar optical interconnections by use of analog gray-scale lithography with high-energy-beam-sensitive glass", Applied Optics, vol. 38, No. 14, pp. 2986-2990, May 10, 1999.

CN Application # 202080010535.0 Office Action dated Sep. 20, 2023.

U.S. Appl. No. 17/509,001 Office Action dated Oct. 25, 2023.

CN Application # 202111600645.5 Office Action dated Apr. 3, 2024.

* cited by examiner

FOLDED OPTICAL CONJUGATE LENS

CROSS-REFERENCE TO RELATED APPLICATION

This application claims the benefit of U.S. Provisional Patent Application 63/022,501, filed May 10, 2020, which is incorporated herein by reference.

FIELD OF THE INVENTION

The present invention relates generally to optoelectronic devices, and particularly to beam-forming optics for optical emitters.

BACKGROUND

Semiconductor lasers, such as vertical-cavity semiconductor lasers (VCSELs), are used for illumination tasks especially in portable devices, where compact light sources are required. (The terms "optical rays," "optical radiation," and "light," as used in the present description and in the claims, refer generally to any and all of visible, infrared, and ultraviolet radiation.) VCSELs may be produced in front-emitting and back-emitting configurations. In the back-emitting configuration, the VCSEL is fabricated on a first face of a semiconductor substrate, and emits optical radiation through the substrate toward and through its second face.

VCSELs and other sorts of solid-state light emitters are commonly integrated with a small lens (referred to as a microlens) that directs and collimates the emitted beam. An array of such microlenses may be fabricated integrally over a semiconductor substrate on which an array of emitters is formed, with the microlenses in alignment with the emitters.

SUMMARY

Embodiments of the present invention that are described hereinbelow provide improved designs and methods for controlling the output beam from a solid-state radiation source.

There is therefore provided, in accordance with an embodiment of the invention, an optoelectronic device, including a semiconductor substrate having first and second faces and an emitter, which is disposed on the first face of the semiconductor substrate and is configured to emit a beam of radiation through the substrate. At least one curved optical surface is formed in the second face of the semiconductor substrate. A first reflector is disposed on the first face in proximity to the emitter, and a second reflector is disposed on the second face in proximity to the curved optical surface, such that the second reflector reflects the beam that was emitted through the semiconductor substrate by the emitter to reflect back through the semiconductor substrate toward the first reflector, which then reflects the beam to pass through the semiconductor substrate so as to exit from the semiconductor substrate through the curved optical surface.

In a disclosed embodiment, the at least one curved optical surface includes a spherical surface.

In some embodiments, the semiconductor substrate includes a III-V semiconductor compound. In a disclosed embodiment, the III-V semiconductor compound includes gallium (Ga) and arsenic (As).

Additionally or alternatively, the emitter includes a vertical-cavity surface-emitting laser (VCSEL). In a disclosed embodiment, the VCSEL includes a mesa having sidewalls and a lower distributed Bragg reflector (DBR) disposed on the first face of the substrate, and the lower DBR extends across the first face beyond the sidewalls of the mesa so as to define the first reflector.

Alternatively, the first reflector includes a metal layer disposed on the first face of the substrate.

In some embodiments, the second reflector is disposed at an apex of the curved optical surface. The second reflector may be planar or curved.

Alternatively, the second reflector is tilted relative to a normal to the substrate. In some embodiments, the curved optical surface is offset on the second face of the semiconductor substrate relative to the emitter. In a disclosed embodiment, an offset of the curved optical surface relative to the emitter is selected so that the beam exiting from the semiconductor substrate through the curved optical surface is perpendicular to the semiconductor substrate. Additionally or alternatively, the at least first and second optoelectronic devices are spaced apart on the substrate by a given device spacing, and the at least first and second devices have respective first and second offsets of the curved optical surface relative to the emitter in different first and second directions, which are selected so that the respective first and second beams exiting through the respective curved optical surfaces are spaced apart by a pitch that is smaller than the device spacing.

In some embodiments, the at least one curved optical surface is shaped so as to focus the beam to a waist at a specified distance from the semiconductor substrate. In one such embodiment, the semiconductor substrate is mounted behind a panel containing a transparent window, such that the waist of the beam is located within the transparent window.

There is also provided, in accordance with an embodiment of the invention, an optoelectronic assembly, which includes a display, including a display substrate, which is transparent to optical radiation at a given wavelength, and an array of display cells including pixel circuit elements disposed on the display substrate with one or more gaps defining transparent windows between the pixel circuit elements. An emitter device includes a semiconductor substrate having first and second faces and one or more emitters, which are disposed on the first face of the semiconductor substrate and are configured to emit respective beams of optical radiation through the substrate. One or more curved optical surfaces are formed in the second face of the semiconductor substrate and are configured to focus the one or more beams emitted from the emitters to respective waists that are aligned in respective ones of the transparent windows.

In a disclosed embodiment, the emitter device includes multiple reflectors associated with each of the one or more emitters, so that the one or more beams are reflected within the semiconductor substrate multiple times before exiting through the curved optical surfaces.

Methods for producing and operating optoelectronic devices and assemblies are also provided.

The present invention will be more fully understood from the following detailed description of the embodiments thereof, taken together with the drawings in which:

DETAILED DESCRIPTION OF EMBODIMENTS

Figure 1:
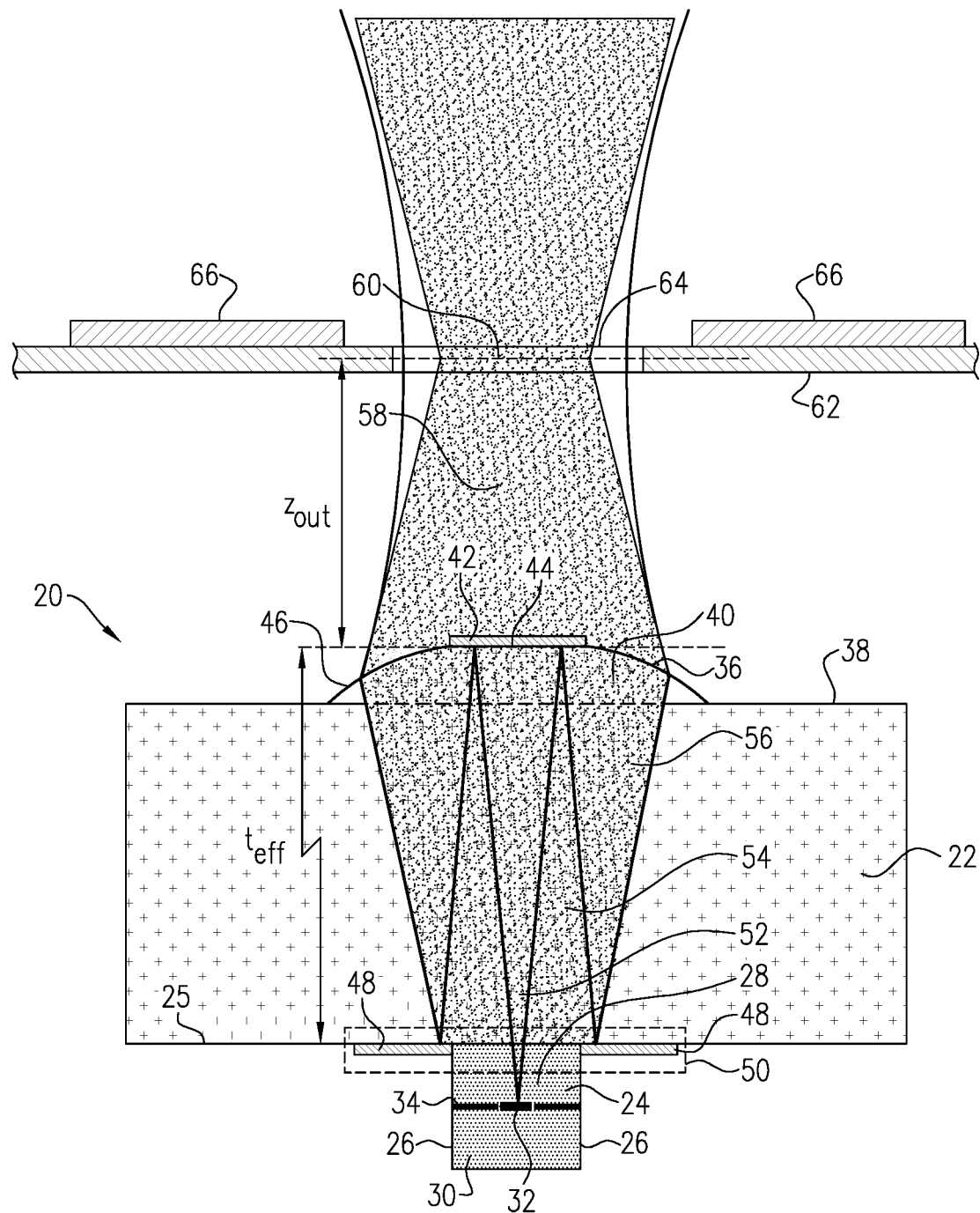
FIG. 1 is a schematic sectional view of an optoelectronic device, in accordance with an embodiment of the present invention.

Semiconductor lasers, such as vertical-cavity semiconductor lasers (VCSELs), can be used for illumination tasks especially in portable devices, in which compact light sources are required. Some applications require that the waist of the Gaussian beam emitted by a VCSEL be located at a specific distance from the VCSEL in order to match the locations of the other components of the device. For example, the application may require that the beam be focused so as to pass through a small aperture, such as an aperture between the pixels of a display. In back-emitting VCSELs, which are formed on a first face of a semiconductor substrate, the focal distance of the Gaussian beam (i.e., the distance to the waist of the beam) exiting through the second face of the substrate may be controlled for this purpose by a microlens formed on the second face. Due to size and process constraints, however, the focal distances of such microlenses may be too short to match the locations of the other components.

The embodiments of the present invention that are described herein address these problems by providing a compact optoelectronic device in which the beam emitted by a solid-state emitter through a semiconductor substrate, such as a back-emitting VCSEL, is reflected multiple times through the substrate and focused, so that the Gaussian waist of the beam is formed at a large distance from the substrate, relative to solutions that are known in the art.

In the disclosed embodiments, a microlens is formed on the semiconductor substrate opposite the emitter. Two reflectors are formed on the two faces of the substrate: a first reflector formed on the first face near the emitter, and a second reflector disposed on the second face on or near the curved optical surface of the microlens. The emitter emits a beam of optical radiation through the substrate toward the second reflector, which reflects the beam back through the substrate onto the first reflector. The first reflector further reflects the beam toward the curved optical surface, which refracts the beam and transmits it out of the substrate.

In the disclosed embodiments, the first reflector is planar, whereas the second reflector may be either concave, planar, or convex. A planar second reflector increases the effective optical thickness of the substrate (by causing the beam to pass through the substrate multiple times before exiting through the curved optical surface), and in this way increases the distance of the beam waist from the substrate. When employing a curved second reflector, the radii of curvature of the second reflector and the curved optical surface are chosen so that reflectors and the curved optical surface together form a telescope, which projects the beam waist of the emitted beam to the required distance.

In some embodiments, the second reflector is tilted so that the reflected beam is shifted laterally. This shift prevents the second reflector from obscuring the beam as it exits through the curved optical surface. An offset of the curved optical surface may be used to compensate for the tilt introduced by the second reflector. The direction of the lateral offset in the plane of the substrate may be controlled by the direction of the tilt and the respective offsets of the second reflector and the curved optical surface. By appropriate selection of the sizes and directions of these lateral offsets, a group of two or more (possibly up to six) emitters may be formed with the lateral distances between the emitted rays smaller than the distance between the respective VCSELs.

FIG. 1 is a schematic sectional view of an optoelectronic device 20, in accordance with an embodiment of the present invention.

Optoelectronic device 20 is formed on a semiconductor substrate 22. Typically, substrate 22 comprises a wafer of a III-V semiconductor compound, such as gallium-arsenide (GaAs), which is transparent to near-infrared radiation. A VCSEL 24 is formed on a first face 25 of substrate 22 using semiconductor fabrication methods and processes that are known in the art. A laser cavity for VCSEL 24 is formed by epitaxial deposition of thin-film layers to produce a lower distributed Bragg-grating (DBR) 28 and an upper DBR 30, wherein the DBRs comprise highly reflective multilayer mirrors. A multiple-quantum-well (MQW) stack 32, comprising a series of quantum wells disposed between a series of barriers, is deposited over lower DBR 28, and upper DBR 30 is deposited over the MQW stack. For example, MQW stack 32 may comprise alternating InAlGaAs quantum wells and InAlGaAs barriers. VCSEL 24 is etched to form a mesa-structure with sidewalls 26, and an oxide aperture is formed to define the optical and electrical current aperture of the VCSEL.

For the sake of simplicity, additional layers of VCSEL 24, such as electrical conductors, have been omitted from the figure.

A curved optical surface 36 has been formed on a second face 38 of substrate 22, forming a microlens 40 with a focal length of f. Such curved optical surfaces can be formed on substrate 22 by methods known in the art, such as gray-scale photolithography or the Confined Etchant Layer Technique (CELT). In the present embodiment, curved optical surface 36 is a spherical surface with a radius of curvature of $R_1$. Alternatively, curved optical surface 36 may be an aspheric surface, such as, for example, a parabola, or may have any other suitable form.

Optical device 20 also comprises a second reflector deposited on second face 38 in proximity to curved optical surface 36. In the pictured embodiment, second reflector 42 is formed over an apex 44 of microlens 40. The area for second reflector 42 is formed in the same processing steps as curved optical surface 36. Alternatively, additional patterning and etch steps, such as those, for example, described with reference to FIG. 2, may be used to flatten apex 44. Second reflector 42 may be either flat or have a concave or convex shape toward VCSEL 24.

After etching of curved optical surface 36 and apex 44, second face 38 is passivated, and an anti-reflective coating 46, for example, comprising a quarter-wave layer of silicon-nitride (SiN) is deposited on curved optical surface 36. Second reflector 42 is formed on apex 44 by coating the apex with gold, which provides a reflectance of 97% for near-infrared radiation emitted by VCSEL 24 (for example at 940 nm), or with another suitable metal or multi-layer thin film coating.

Lower DBR 28 and a metallic redistribution layer (RDL) (a metal layer between electrodes of VCSEL 24 and substrate 22) together form a first reflector 50 on first face 25. At the near-IR wavelength of VCSEL 24, the reflectance of lower DBR 28 is typically 99%, and the reflectance of RDL 48 exceeds 94%. In an alternative embodiment (not shown in the figures), some of the epitaxial layers of lower DBR 28 are not etched away in forming the mesa structure of VCSEL 24, and thus extend across face 25 of substrate 22 beyond sidewalls 26 and define the entire area of reflector 50. In this case, reflector 50 may have higher overall reflectance, without gaps at the boundary between lower DBR 28 and RDL 48.

VCSEL 24 emits a diverging beam 52 of optical radiation, which is reflected by second reflector 42 toward first reflector 50 as a beam 54. First reflector 50 reflects beam 54 into a beam 56, which propagates toward second face 38. When second reflector 42 is planar (infinite radius of curvature), beam 54 continues diverging with the same divergence as beam 52. Due to the planar form of first reflector 50, this divergence is preserved in beam 56, too, thus causing the outer part of beam 56 to impinge on curved optical surface 36 outside second reflector 42. This part of beam 56 is refracted by curved optical surface 36 into a beam 58, having a waist 60 located a distance $z_{out}$ above apex 44. Due to the back-and-forth reflections between first and second reflectors 50 and 42, respectively, the optical path for the beam emitted by VCSEL 24 and exiting through curved optical surface 36 is effectively tripled, as compared to a beam exiting without these reflections.

Assuming beam 52 to be Gaussian, the distance $z_{out}$ is given by:

$$\frac{1}{z_{out}} = \frac{1}{f} - \frac{1}{t_{eff} + z_r^2/(t_{eff} - f)} \quad (1)$$

wherein the parameters of the equation are:
f=the focal length of microlens 40.
$t_{eff}$=the optical thickness of substrate 22, $t_{sub}$, multiplied by the number of passes of the beam through the substrate in the multi-pass geometry.
$z_r$=the Rayleigh range of VCSEL 24.

This equation illustrates that for a given focal length f, the multi-pass geometry of device 20 can be used to position waist 60 at a substantially greater distance from second face 38 than would be possible in a conventional, single-pass geometry. Typical values for these parameters are $t_{sub}$=100-200 μm, f=50-100 μm, and $z_r$=50 μm, although other parameter values may alternatively be used.

In alternative embodiments, second reflector 42 is formed with a curved optical surface. Forming second reflector 42 with a convex shape towards VCSEL 24 provides for additional optical power for the optics of optoelectronic device 20 and requires a larger diameter for microlens 40, as compared to a planar shape of the second reflector. Conversely, forming second reflector 42 with a concave shape towards VCSEL 24 reduces the optical power and the required diameter for microlens 40.

Increasing the distance $z_{out}$ to beam waist 60 in device 20 is particularly useful when device 20 is to be mounted behind a panel 62, such as a circuit substrate, and is required to emit beam 58 through a transparent window 64 in the panel. By proper choice of the thickness of substrate 22 and the parameters of optical surface 36, it is possible to achieve values of $z_{out}$ in the range of 300-500 μm, which is sufficient to enable mounting substrate 22 behind panel 62 so that waist 60 is aligned within window 64 with reasonable design tolerances. When aligned in this manner, beam 58 will pass through panel 62 with only minimal scatter and loss.

For example, electronic display layouts can be designed with a transparent window in a gap between the pixel circuit elements within each pixel of the display. Such a display typically comprises a substrate, such as glass, which is transparent to optical radiation at wavelengths in the visible and near infrared ranges. An array of display cells is formed on the substrate by methods of display fabrication that are known in the art. Each display cell comprises pixel circuit elements 66, such as an OLED (organic light-emitting diode) and a TFT (thin-film transistor) for switching the OLED, as well as conductors connecting the pixel circuits to electronics external to the display.

The display cells are spaced on the substrate (for example, on panel 62 in the example shown in FIG. 1) at a certain pixel pitch, with gaps of a predefined size, defining one or more transparent windows 64, between the pixel circuit elements. One or more VCSELs 24 are placed behind respective windows 64 and are aligned so that each beam 58 passes through the corresponding window. Specifically, device 20 is designed, based on the principles explained above, and aligned with the display so that the beam waist 60 of each device falls within window 64.

A single VCSEL 24 or an array of VCSELs behind an array of windows 64 in a display panel can thus provide illumination for applications of a mobile computing device, such as a smartphone or tablet computer. In this manner, the area of the display can be maximized, relative to the size of the computing device, without requiring that panel space be allocated for the illumination source. For example, the VCSELs can illuminate the area in front of the display for applications such as 3D mapping or face recognition.

Figure 2:
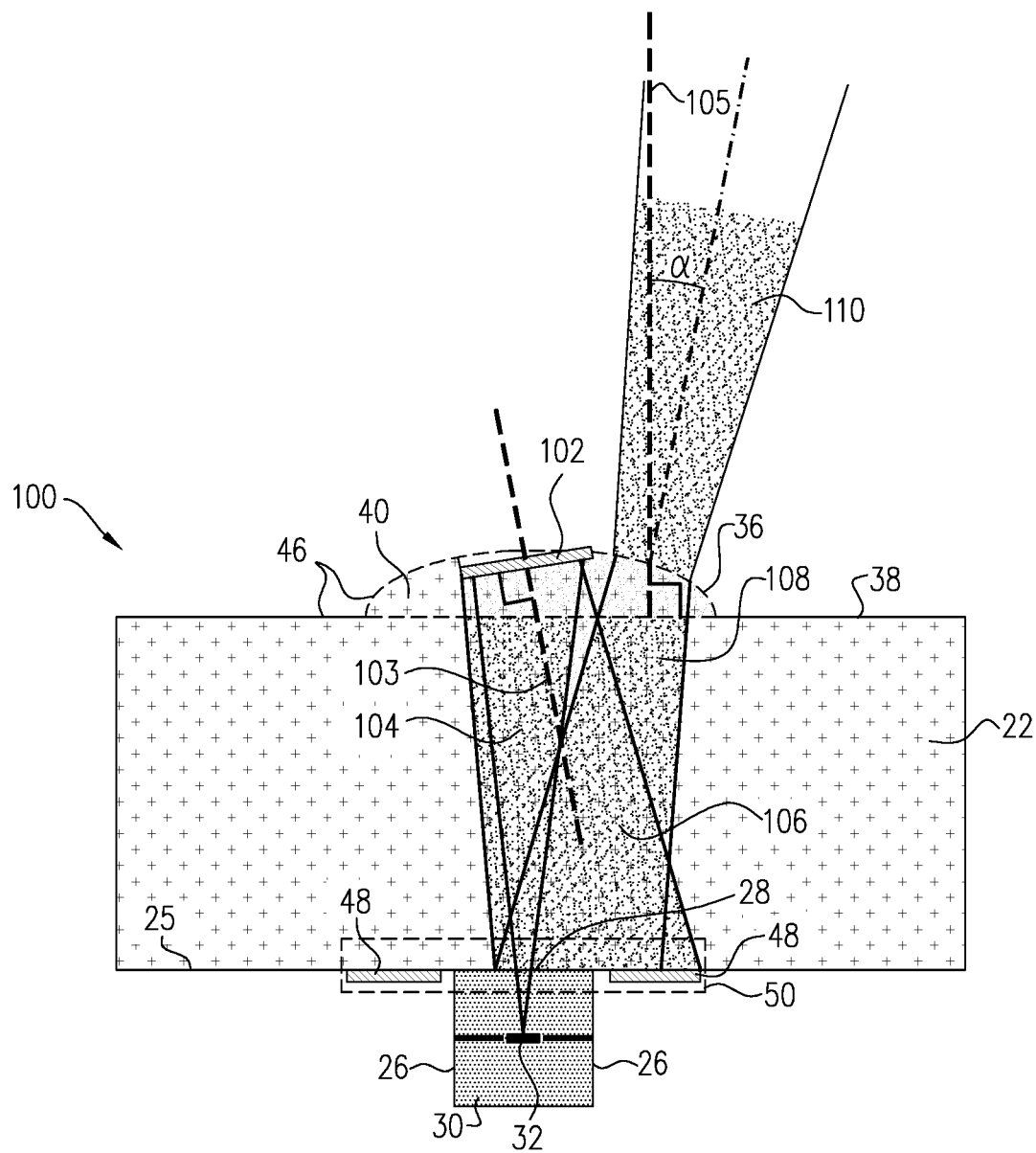
FIG. 2 is a schematic sectional view of an optoelectronic device, in accordance with another embodiment of the present invention.

FIG. 2 is a schematic sectional view of an optoelectronic device 100, in accordance with another embodiment of the present invention.

Optoelectronic device 100 comprises, similarly to optoelectronic device 20, VCSEL 24 on first face 25 of substrate 22 and microlens 40 on second face 38. A planar second reflector 102, having a normal 103 to its surface, is tilted with respect to a normal 105 of substrate 22 (i.e., normal 103 is not parallel to normal 105 of substrate 22). As in the embodiment of FIG. 1, the tilted area is coated with gold or other suitable materials for high reflectance. Alternatively, second reflector 102 may have a curved shape.

Beam 104 emitted by VCSEL 24 impinges on second reflector 102, which reflects it as a beam 106 toward first reflector 50. As second reflector 102 is tilted, beam 106 impinges on first reflector 50 at a non-normal angle and with a lateral offset from VCSEL 24. Consequently, with a suitable tilt angle of second reflector 102, a beam 108 reflected from first reflector 50 impinges on curved optical surface 36 of microlens 40 avoiding second reflector 102, thus reducing multiple reflections and increasing the output coupling efficiency. Beam 108 is refracted by microlens 40 and exits as a beam 110. In the embodiment shown in FIG. 2, beam 110 exits from microlens 40 at a non-zero exit angle α with respect to normal 105 of substrate 22. In an alternative embodiment, beam 110 is directed along a normal to substrate 22 (i.e., exit angle α is brought to zero) by a suitable lateral offset of microlens 40 relative to VCSEL 24, as shown in FIG. 3, below.

Figure 3:
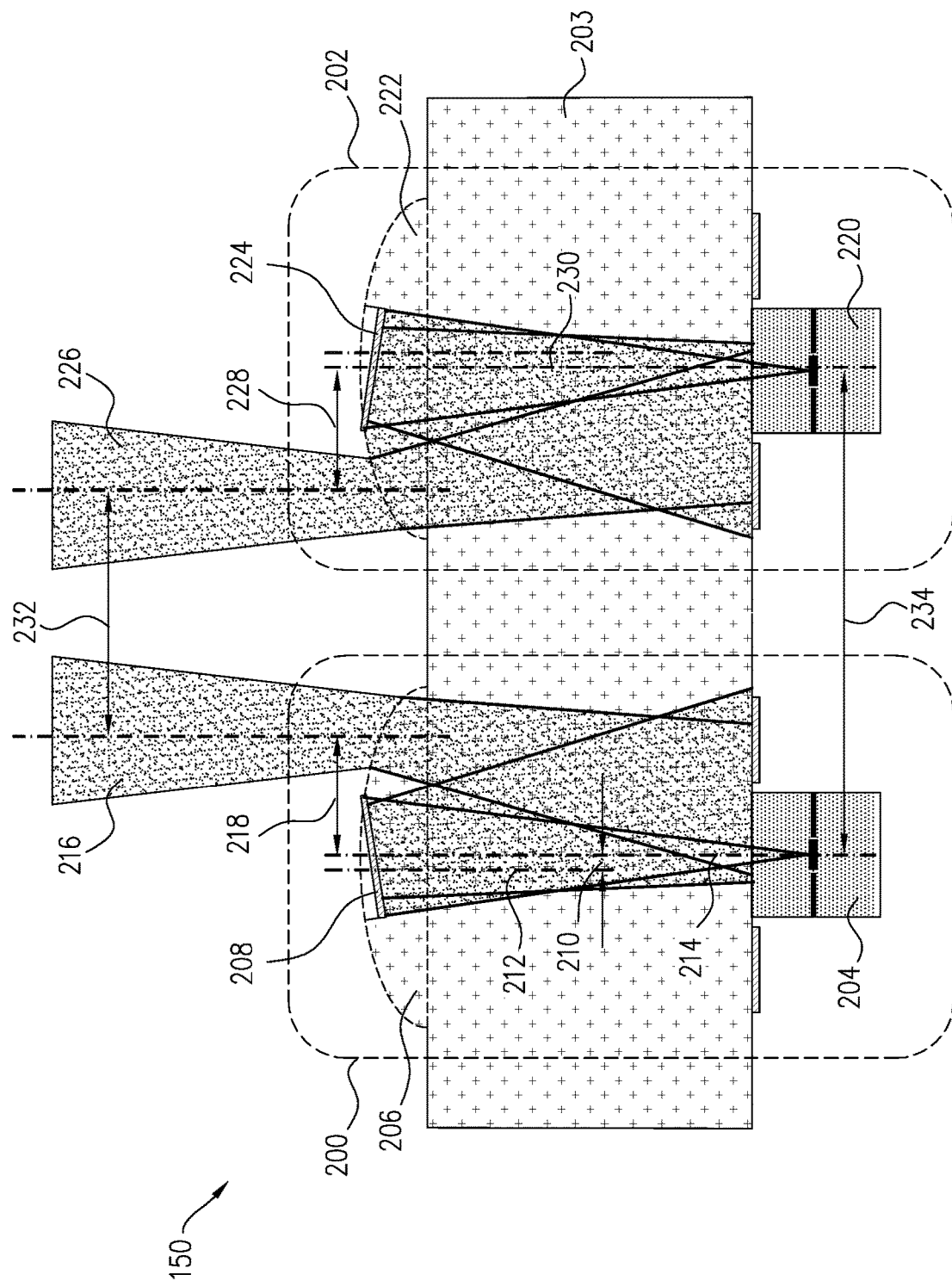
FIG. 3 is a schematic sectional view of an optoelectronic assembly, in accordance with a further embodiment of the present invention.

FIG. 3 is a schematic sectional view of an optoelectronic assembly 150 comprising a pair of optoelectronic devices 200 and 202, in accordance with an additional embodiment of the present invention. Optoelectronic devices 200 and 202, formed on a substrate 203, are similar to optoelectronic device 100. Optoelectronic device 200 comprises a VCSEL 204, a microlens 206, and a tilted second reflector 208, corresponding respectively to VCSEL 24, microlens 40, and second reflector 102 of optoelectronic device 100. Microlens 206 is positioned with an offset 210 between its optical axis 212 and an optical axis 214 of VCSEL 204. Offset 210 has been selected so that a beam 216, exiting from microlens 206, is perpendicular to substrate 203, with an offset of 218 from optical axis 214 of VCSEL 204. Additional labels, such as in FIG. 2, have been omitted for the sake of clarity.

Optoelectronic device 202 comprises a VCSEL 220, a microlens 222, and a tilted second reflector 224. Optoelectronic device 202 is identical to optoelectronic device 200, except that it is oriented with a 180° rotation around a normal to substrate 203 by comparison with device 200. Thus, a beam 226 emitted by optoelectronic device 202 is perpendicular to substrate 203 with an offset 228 to an optical axis 230 of VCSEL 220, equal and opposite to offset 218 of device 200.

Due to the relative orientations of optoelectronic devices 200 and 202, a spacing (or pitch) 232 between beams 216 and 226 is substantially smaller than a spacing 234 between optical axes 214 and 228 of VCSELs 204 and 220. Thus, beams 216 and 226 may pass together through a relatively narrow aperture (not shown) above device 150 and create a dense pattern of beams or a combined beam of high intensity in the far field.

In alternative embodiments, a larger number of optoelectronic devices, similar to devices 200 and 202, may be arranged in close proximity to each other and with suitable rotations around normals to the substrate, thus achieving beam-to-beam pitches that are smaller than the corresponding VCSEL-to-VCSEL pitches. A reduction of beam-to-beam pitches may be achieved with up to six devices.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic device, comprising:
a semiconductor substrate having first and second faces;
an emitter, which comprises a mesa, having sidewalls, disposed on the first face of the semiconductor substrate and is configured to emit a beam of radiation through the substrate;
at least one curved optical surface, which is formed in the second face of the semiconductor substrate; and
a first reflector, having a reflectance exceeding 94%, extending across the first face beyond the sidewalls of the mesa in proximity to the emitter and a second reflector, which is planar and is disposed on the second face in proximity to the curved optical surface, such that the second reflector reflects the beam that was emitted through the semiconductor substrate by the emitter to reflect back through the semiconductor substrate toward the first reflector, which then reflects the beam to pass through the semiconductor substrate so as to exit from the semiconductor substrate through the curved optical surface.

2. The optoelectronic device according to claim 1, wherein the at least one curved optical surface comprises a spherical surface.

3. The optoelectronic device according to claim 1, wherein the semiconductor substrate comprises a III-V semiconductor compound.

4. The optoelectronic device according to claim 3, wherein the III-V semiconductor compound comprises gallium (Ga) and arsenic (As).

5. The optoelectronic device according to claim 1, wherein the emitter comprises a vertical-cavity surface-emitting laser (VCSEL).

6. The optoelectronic device according to claim 5, wherein the VCSEL comprises a lower distributed Bragg reflector (DBR) disposed on the first face of the substrate, and wherein the lower DBR extends across the first face beyond the sidewalls of the mesa so as to define the first reflector.

7. The optoelectronic device according to claim 1, wherein the first reflector comprises a metal layer disposed on the first face of the substrate.

8. The optoelectronic device according to claim 1, wherein the second reflector is disposed at an apex of the curved optical surface.

9. The optoelectronic device according to claim 1, wherein the second reflector is tilted relative to a normal to the substrate.

10. The optoelectronic device according to claim 9, wherein the curved optical surface is offset on the second face of the semiconductor substrate relative to the emitter.

11. The optoelectronic device according to claim 10, wherein an offset of the curved optical surface relative to the emitter is selected so that the beam exiting from the semiconductor substrate through the curved optical surface is perpendicular to the semiconductor substrate.

12. An assembly comprising at least first and second optoelectronic devices, each of the optoelectronic devices comprising:
a semiconductor substrate having first and second faces;
an emitter, comprising a mesa having sidewalls, which is disposed on the first face of the semiconductor substrate and is configured to emit a beam of radiation through the substrate;
at least one curved optical surface, which is formed in the second face of the semiconductor substrate; and
a first reflector extending across the first face beyond the sidewalls of the mesa in proximity to the emitter and a second reflector disposed on the second face in proximity to the curved optical surface, such that the second reflector reflects the beam that was emitted through the semiconductor substrate by the emitter to reflect back through the semiconductor substrate toward the first reflector, which then reflects the beam to pass through the semiconductor substrate so as to exit from the semiconductor substrate through the curved optical surface,
wherein the second reflector is tilted relative to a normal to the substrate,
wherein the curved optical surface is offset on the second face of the semiconductor substrate relative to the emitter by an offset selected so that the beam exiting from the semiconductor substrate through the curved optical surface is perpendicular to the semiconductor substrate, and
wherein the at least first and second optoelectronic devices are spaced apart on the substrate by a given device spacing, and the at least first and second devices have respective first and second offsets of the curved optical surface relative to the emitter in different first and second directions, which are selected so that the respective first and second beams exiting through the respective curved optical surfaces are spaced apart by a pitch that is smaller than the device spacing.

13. The optoelectronic device according to claim 1, wherein the at least one curved optical surface is shaped so as to focus the beam to a waist at a specified distance from the semiconductor substrate.

14. The optoelectronic device according to claim 13, wherein the semiconductor substrate is mounted behind a panel containing a transparent window, such that the waist of the beam is located within the transparent window.

15. The optoelectronic device according to claim 1, wherein the second reflector is disposed on the curved optical surface.

* * * * *